United States Patent [19]
Belcher et al.

[11] Patent Number: 5,679,267
[45] Date of Patent: *Oct. 21, 1997

[54] DUAL ETCHING OF CERAMIC MATERIALS WITH AN ELEVATED THIN FILM

[75] Inventors: James F. Belcher, Plano; Robert A. Owen, Rowlett, both of Tex.

[73] Assignee: Texas Instruments Incorporated, Dallas, Tex.

[*] Notice: The term of this patent shall not extend beyond the expiration date of Pat. No. 5,466,331.

[21] Appl. No.: 586,358

[22] Filed: Jan. 16, 1996

Related U.S. Application Data

[63] Continuation of Ser. No. 223,088, Apr. 4, 1994, abandoned.

[51] Int. Cl.$^6$ .................................................. B44C 1/22
[52] U.S. Cl. .......................... 216/12; 216/52; 216/20; 216/80; 216/65; 216/19; 216/47; 216/49; 216/76; 437/228 SEN; 430/320; 430/312; 430/311
[58] Field of Search ...................... 430/311, 312, 430/313, 316, 314, 317, 319, 320, 322, 323, 324; 437/228 CE, 228 ES, 228 TR, 228 SEN, 228 OR, 3, 5, 18, 927; 216/17, 52, 19, 20, 65, 48, 49, 76, 80; 156/644.1, 648.1, 651.1, 659.1, 633.1, 630.1, 661.11

[56] References Cited

U.S. PATENT DOCUMENTS

| | | | |
|---|---|---|---|
| 3,359,192 | 12/1967 | Heinrich et al. | 156/644.1 |
| 4,080,532 | 3/1978 | Hopper | 250/332 |
| 4,139,444 | 2/1979 | Singer et al. | 156/656 |
| 4,662,984 | 5/1987 | Ohtake et al. | 156/644 |
| 4,740,700 | 4/1988 | Shabam et al. | 156/633 |
| 4,745,278 | 5/1988 | Hanson | 250/338.2 |
| 4,792,681 | 12/1988 | Hanson | 250/338.2 |
| 4,926,051 | 5/1990 | Turnbull | 437/3 |
| 4,927,771 | 5/1990 | Ferrett | 437/974 |
| 5,115,442 | 5/1992 | Lee et al. | 437/129 |
| 5,426,304 | 6/1995 | Belcher et al. | 250/332 |
| 5,466,331 | 11/1995 | Belcher | 216/17 |
| 5,466,332 | 11/1995 | Owen et al. | 156/643.1 |

OTHER PUBLICATIONS

D. J. Warner, D. J. Pedder, J. S. Moody, and J. Burrage, "The Preparation and Performance of Reticulated Targets for the Pyroelectric Vidicon", *Ferroelectrics*, 33, 1981, pp. 249–253.

R. Watton, F. Ainger, S. Porter, D. Pedder and J. Gooding, "Technologies and Performance for Linear and Two Dimensional Pyroelectric Arrays", SPIE vol. 510, Infrared Technology X, 1984, pp. 139–140.

T. D. Flaim, G. A. Barner, and T. Brewer, "A Novel Release Layer syster for IC Processing", Brewer Science, Inc. Rolla, Missouri, presented at KTI IF Conference, Nov. 1989.

C. Hanson, H. Beratan, R. Owen, and K. Sweetser, "Low-Cost Uncooled Focal Plane Array Technology", Texas Instruments Incorporated, DSEG, presented at IRIS Specialty Group on Infrared Detectors, Bedford, MA, Jul. 14, 1993.

(List continued on next page.)

*Primary Examiner*—Martin Angebranndt
*Attorney, Agent, or Firm*—Brian A. Carlson; James C. Kesterson; Richard L. Donaldson

[57] ABSTRACT

A novel reticulated array comprises islands of ceramic (e.g. BST 40) which are fabricated from novel materials using unique methods of patterning. A shallow etch stop trench (46) is first ion milled around each ceramic island on the front side and then filled with an etch step material (e.g. parylene 48). An optical coat (e.g transparent metal layer 54, transparent organic layer 56 and conductive metallic layer 58) is elevated above the etch step material by an elevation layer (e.g. polyimide 49). For some applications, it has been experimentally verified that there is no loss, and sometimes a measured increase, in optical efficiency when the optical coating is not planar in topology. Novel fabrication methods also provide for the convenient electrical and mechanical bonding of each of the massive number of ceramic islands to a signal processor substrate (e.g. Si 86) containing a massive array of sensing circuits.

22 Claims, 4 Drawing Sheets

OTHER PUBLICATIONS

C. Hanson, "Uncooled Thermal Imaging at Texas Instruments", SPIE 1993, International Symposium on Optics, Imaging and Instrumentation, Infrared Technology XIX, San Diego, Jul. 14, 1993.

H. Kaufman, R. Robinson, W. Hughes, "Characteristics, Capabilities, and Applications of Broad–Beam Sources", Commonwealth Scientific Corporation, Alexandria, Virginia, 1987.

R. Watton, "Ferroelectrics for Infrared Detection and Imaging", *ISAF '86, Proceedings of the Sixth IEEE International Symposium on Applications of Ferroelectrics*, Jun. 1986.

DUAL ETCHING OF CERAMIC MATERIALS WITH AN ELEVATED THIN FILM

This application is a continuation of application Ser. No. 08/223,088, filed Apr. 4, 1994, now abandoned.

CROSS-REFERENCES TO RELATED APPLICATIONS

The following related applications were filed concurrently with the instant application:

| Title | Inventors | Patent/Ser. No./ Filing Status |
| --- | --- | --- |
| Dual Etching of Ceramic Materials | Owen, Belcher | 5,466,532 |
| Etching of Ceramic Materials with an Elevated Thin Film | Belcher, Owen | 08/664,047, pending, continuation of 08/223,073, abandoned |
| Dual Etching of Ceramic Materials with a Thin Front Film | Belcher, Owen | 08/568,704, pending, continuation of 08/222,769, abandoned |
| An Elevated Thin Film for Ceramic Materials | Belcher | 5,466,331 |
| Multiple Level Mask for Patterning of Ceramic Materials | Belcher, Frank, Jones, Long | 08/222,146, allowed. |

FIELD OF INVENTION

This invention generally relates to uncooled infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, March 1978; (2) U.S. Pat. No. 4,745,278, Hanson, May 1988; (3) U.S. Pat. No. 4,792,681, Hanson, December 1988; and (4) "LOW-COST UNCOOLED FOCAL PLANE ARRAY TECHNOLOGY", by Hanson, Beratan, Owen and Sweetser, presented Aug. 17, 1993 at the IRIS Detector Specialty Review.

The physical requirements of uncooled arrays and a brief description of current fabrication processes will be presented to aid in the understanding of the improvements realized by the novel methods to be described.

An area imager may contain several hundred to tens of thousand individual picture elements (pixels). Each of these pixels consists of a capacitor (or resistor or another type of electronic element) that has a heat (IR intensity) sensitivity. Making use of the fact that the charge stored by a capacitor is proportional to the product of its terminal voltage and its capacitance, electronic circuitry can be attached to the two terminals of the capacitor based pixel to measure the intensity of the IR impinging on a specific pixel. Obstructions in the imaging field are removed and the electronic connections to these capacitors are simplified if one of the capacitor terminals is made common to all. Hundreds to tens of thousands of connections must still be made between the other isolated terminals of the capacitors and the electronic sensing circuitry. In addition, the pixel capacitors should be thermally isolated from each other while having one terminal connected to all the other common terminals.

The common connection to one side of the pixel capacitors consists of a front side thin film referred to as the optical coating. This may be a composite of a plurality of thin films which have been optimized with regard to IR absorbency, IR transparency, electrical conductivity, thermal resistivity, etc. The thicker heat sensitive dielectric substrate in this case can be barium-strontium-titanate (BST) which is a ceramic perovskite material.

To leave the front side optical coating thin film electrically conducting while isolating the pixels thermally, one may etch deep trenches around the pixel capacitors in the BST substrate. The optical coating side of the device will be referred to as the front side.

SUMMARY OF THE INVENTION

A preferred embodiment of this invention comprises a novel reticulated array of two-terminal heat sensitive capacitors which are fabricated from novel materials using unique methods of patterning.

Ion milling of the BST substrate is also preferred over other dry processing etching methods such as reactive ion etching, electron cyclotron resonance plasma etching and standard plasma etching because all would require undesired high temperatures to etch properly.

Ion milling can be used from the back side to isolate the pixels. It can be difficult to control this backside ion milling process accurately enough to prevent damage to the optical coating on the front side. As a consequence, a shallow isolating trench is first ion milled around each pixel location on the front side and then filled with an organic material such as parylene. For some applications, optical coat protection may be further enhanced by elevating the optical coat by use of an additional elevation layer.

The novel fabrication method also provides for the convenient electrical and mechanical bonding of each of the massive number of pixel capacitors to an integrated circuit containing a massive array of sensing circuits.

One embodiment of the present invention is a microelectronic structure comprising a substantially undamaged continuous optical coating layer, a reticulated array of ceramic islands disposed on the optical coating layer, and thin electrical contacts disposed on a surface of the ceramic islands opposite the optical coating layer. The optical coating layer comprises elevated portions between and partially overlapping the ceramic islands. In another embodiment the ceramic islands comprise a middle cross-sectional area between the optical coating layer and the electrical contacts that is greater than a first cross-sectional area proximate the optical coating layer, and is greater than a second cross-sectional area proximate the electrical contacts. The infrared sensitive ceramic islands can have reduced thermal mass and increased thermal responsivity due to the smaller first and second cross-sectional areas.

A method of forming an embodiment of the present invention comprises providing a ceramic substrate having a front side and a back side, and etching a first predetermined pattern partially into the front side of the substrate, thereby forming etch stop trenches having the first predetermined pattern. The method further comprises filling the etch stop trenches with an etch stop material, and forming an elevation layer having a second predetermined pattern on the front side of the substrate, wherein the elevation layer substantially aligned with the trenches and covering at least the etch stop material in the trenches. The method further comprises depositing a thin front layer on the front side of the substrate and on the elevation layer, thereby forming elevated portions of the thin front layer above the trenches. The method further comprises etching a third predetermined pattern into the back side of the substrate, wherein the third predetermined pattern is substantially the same as the first predetermined pattern, and is substantially aligned with the etch stop trenches on the front side, thereby forming cavities extending down to and into the etch stop material, but not extending to the thin front layer. The method further comprises removing the etch stop material, and removing the elevation layer, thereby forming isolated islands of the ceramic substrate connected by the thin front layer. The thin front layer remains substantially undamaged, having not been exposed to the etching processes forming the first and third predetermined patterns.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
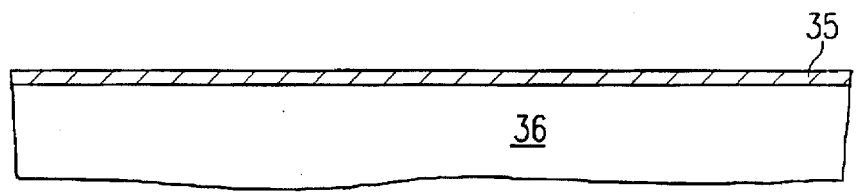
FIG. 1 illustrates the application of a continuous electrode in direct thermal contact with the substrate.

Some of the preferred embodiments will be presented with reference to FIG. 1–15 and Tables 1 and 2. It should be understood that the drawings are for illustrative purposes and are not to dimensional or relative scale. In addition, only a few detectors are illustrated in the figures, but the present invention can be applied to any number of detectors in various configurations (e.g. single line or array).

One of the preferred embodiments uses ion milling of the BST substrate from both the front and back. The front side ion milling forms a trench etch step around the pixel and the backside ion milling completes the thermal isolation without damage to the front side optical coating. Further protection of the optical coating is realized by an additional organic coating over the etch stop. After the removal of this additional organic coating, improved thermal isolation of the pixels results.

Tables 1 and 2, below, provide an overview of some embodiments and the drawings.

TABLE 1

| ID# | Description | Material (dim) | Alternates |
|---|---|---|---|
| 35 | Protective metal layer | NiCr 1000A | 500–5000A TiW, TiW/NiCr, other metals and metal compounds This layer may or may not be present |
| 36 | Substrate | BST 0.06 cm | 0.01–0.25 cm |
| 37 | Etch mask | Tri-level resist | |
| 38 | Tri-level resist top level | Photoresist 1.5 μm | 0.1–2.0 μm |
| 40 | Tri-level resist middle layer | TiW 1000A | 500–1500A Other metals, SiO$_2$ |
| 42 | Tri-level resist bottom layer | Photoresist 15 μm | 0.4–20 μm Polyimide, parylene, epoxy, spin on glass |
| 46 | Trench for etch stop | Ion milled 5 μm cavity | 4–8 μm depth |
| 48 | Elevated etch stop | "PIRL", 12 um above front side | 0.1–20 um Photoresist, SiO$_2$, polyimide, parylene, epoxy, Si$_3$N$_4$ Comprises elevation layer and frontside etch stop in a single layer |
| 49 | Organic elevation layer | "PIRL" 12 um | 0.1–20 um Photoresist, polyimide, parylene |
| 50 | Frontside etch stop | Filler of organic or inorganic type | 4–8 um Photoresist, oxide, polyimide, parylene, epoxy, nitride, "PIRL" |
| 52 | Optical coating | 3 layered | ¼ IR wavelength |
| 54 | Transparent coat | NiCr 50A | 25–100A Other metals or metal compounds |
| 56 | ¼ wavelength separator coat | Parylene 1.4 μm | ¼ desired IR wavelength Other organics (e.g. photoresist, polyamide, epoxy) |
| 58 | Electrical conducting coat | NiCr 1000A | 500–2000A Other metals or metal compounds |
| 60 | Thinned Substrate | BST 18 μm | 1–200 μm |
| 62 | Mechanical carrier | Glass | Silicon, quartz, ceramic |
| 64 | Adhesive | Wax 0–10 um | Epoxy |

TABLE 2

| ID# | Description | Material (dim) | Alternates |
|---|---|---|---|
| 66 | Backside electrical contact | Bonding Alloys | 4 layer composite |
| 68 | | In 3 um | 0.15–6 um |
| 70 | | Au 0.1 um | 0.05–0.15 μm |
| 72 | | NiCr 0.05 um | 0.05–0.15 μm |
| 74 | | TiW 0.05 um | 0.02–0.1 μm |
| 76 | Partially etched pixel isolation | Air | |

TABLE 2-continued

| ID# | Description | Material (dim) | Alternates |
| --- | --- | --- | --- |
| 78 | Fully etched and cleaned pixel isolation | Vacuum | Air, inert gas |
| 79 | Elevated optical coating | where organic has been removed | |
| 80 | IC Contact mesa | Polyimide 12 um | 1–30 um Photoresist, parylene, epoxy |
| 82 | Ohmic connection | TiW 2000A | 100–10,000A Other metals or conductors |
| 84 | IC via | | |
| 86 | IC processor | Si or GaAs | |

The combined optical and electrode coatings are in direct contact with the BST pixel making in a sense a pixel heat sink. Any heat energy in the optical coating flows to the nearest pixel. Even though the optical surface is not planar, the optical imaging is actually superior to a planarized optical coating for some applications. This is due in part to the longer thermal path between pixels along the elevated optical coat. This is also due in part to the ease with which any supporting materials may be completely removed to improve thermal isolation without damage to the optical coating.

Figure 2:
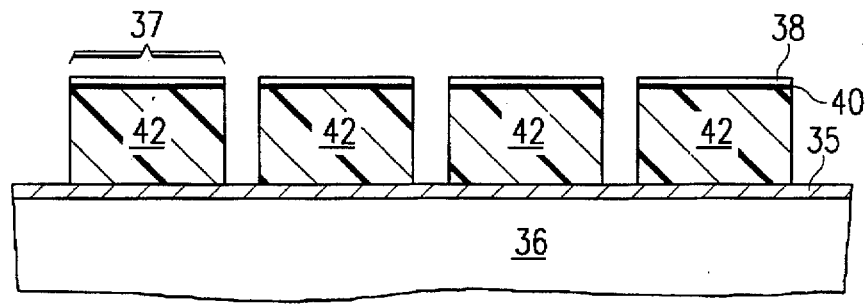
FIG. 2 illustrates the patterned tri-level photoresist exposing the front side of the substrate to be etched for the etch stop.
Figure 3:
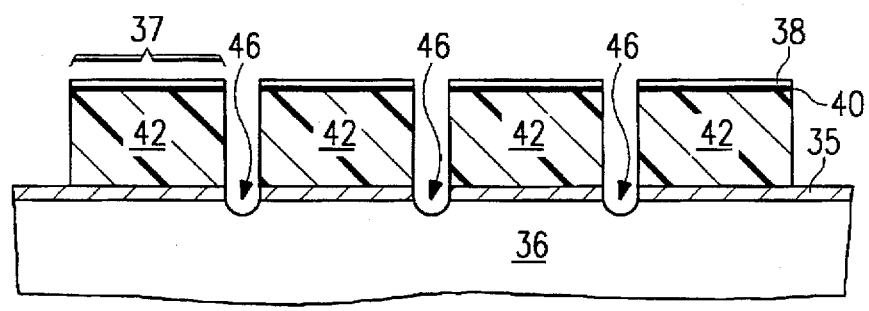
FIG. 3 indicates the etched trenches surrounding each pixel.
Figure 4:
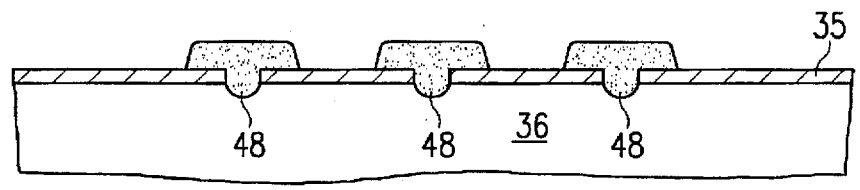
FIG. 4 shows the addition of an organic layer after it has been patterned by photolithography.

The polished BST substrate 36 is covered with a continuous thin film conducting electrode 35 as shown in FIG. 1. This film 35 and the underlying substrate 36 are patterned by tri-level resist 37 to form a trench 46 to be filled with an organic ion mill elevated etch stop 48. The tri-level resist consists of photoresist 38 which is patterned by conventional photolithography. Layer 38 is then used as an etch mask to define the underlying metal layer 40. Beneath 40 is a much thicker layer of photoresist 42. These three layers 38, 40 and 42 serve as the ion mill etch mask for the trenches 46. The details of this process are shown in FIG. 2 and 3 and Table 1.

An elevated etch stop material 48 such as parylene is deposited such that it fills trenches 46 and covers the surface of layer 35. Layer 48 is then patterned by conventional photolithography yielding the structure shown in FIG. 4. In this embodiment, no planarization of the etch stop material is necessary.

Figure 5:
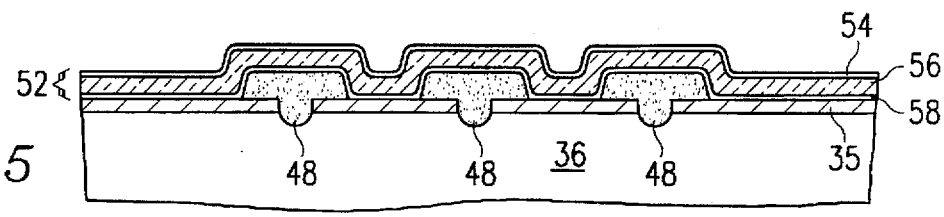
FIG. 5 illustrates (not to scale) the application of the optical coating over both the organic and continuous electrode layers.

The three layered optical coating 52 is now deposited over the entire front side as illustrated in FIG. 5. From the top toward the substrate 36 the three layers of 52 consist of a semi-transparent thin (50 A (angstroms) thick) metal 54 such as nichrome (NiCr) over a 1.4 µm thick layer of transparent organic material 56 such as parylene over a 1000 A thick layer of a conductor 58 such as NiCr. The thickness of layer 56 is designed to make a ¼ wavelength IR filter in conjunction with the surfaces of 54 and 58. Alternate thicknesses and materials are shown in Table 1.

Figure 6:
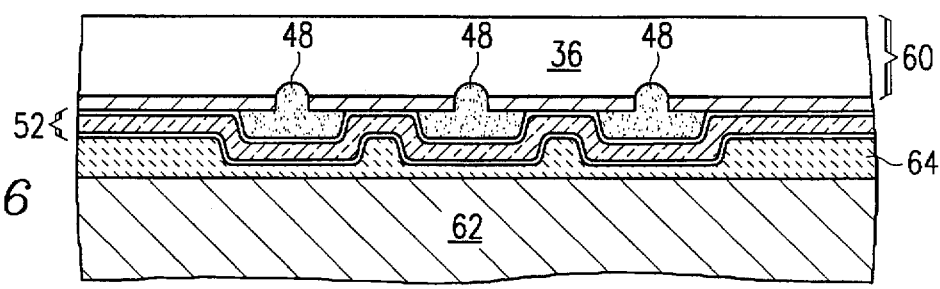
FIG. 6 indicates the mounting of the front side of the substrate to a mechanical carrier.
Figure 7:
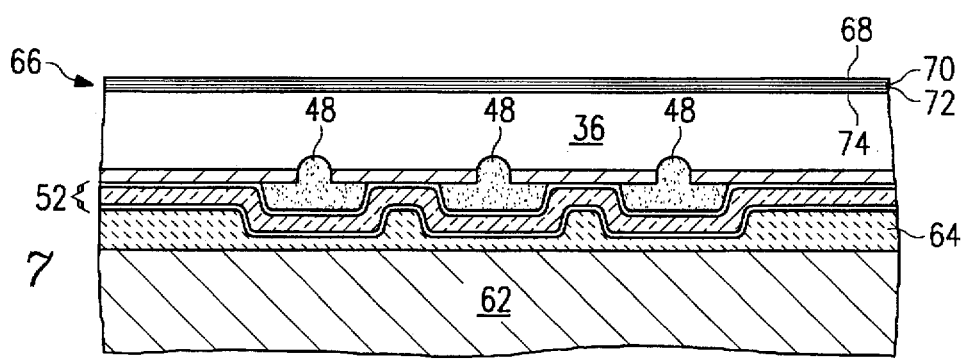
FIG. 7 illustrates the composite after the deposition of the electrical contact metals to the back side.

As shown in FIG. 6, the front side with the optical coating 52 is mounted to a mechanical carrier 62 with a wax adhesive 64 and the back side of the BST substrate 36 is mechanically polished to a thickness 60. Electrical coating 66 is deposited on the back side as shown in FIG. 7. While the composition of 66 is not extremely critical, 66 serves as one side of the pixel capacitor and forms the metallic surfaces to which the complex IC sensing circuits will be mechanically and electrically bonded. The compositions and thicknesses used for 66 are shown in Table 2. From the outside toward the substrate 36 the layers are indium (In) 68, gold (Au) 70, NiCr 72 and TiW 74.

Figure 8:
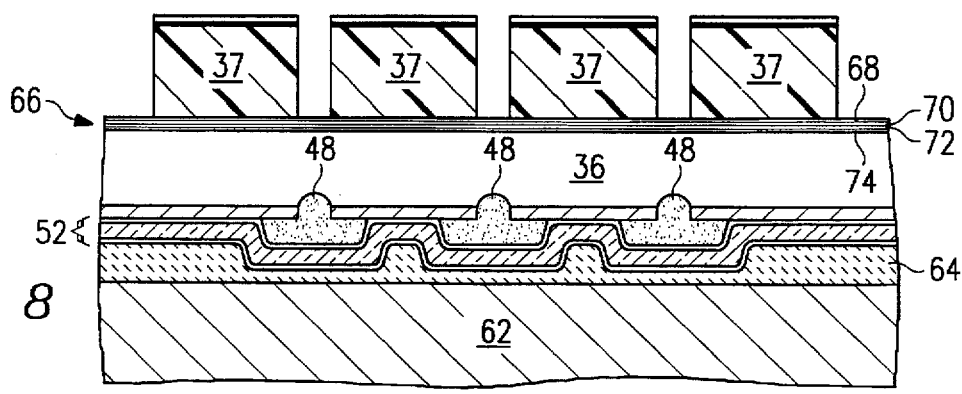
FIG. 8 shows the patterned tri-level photoresist with the openings aligned with the previously made etch stops.
Figure 9:
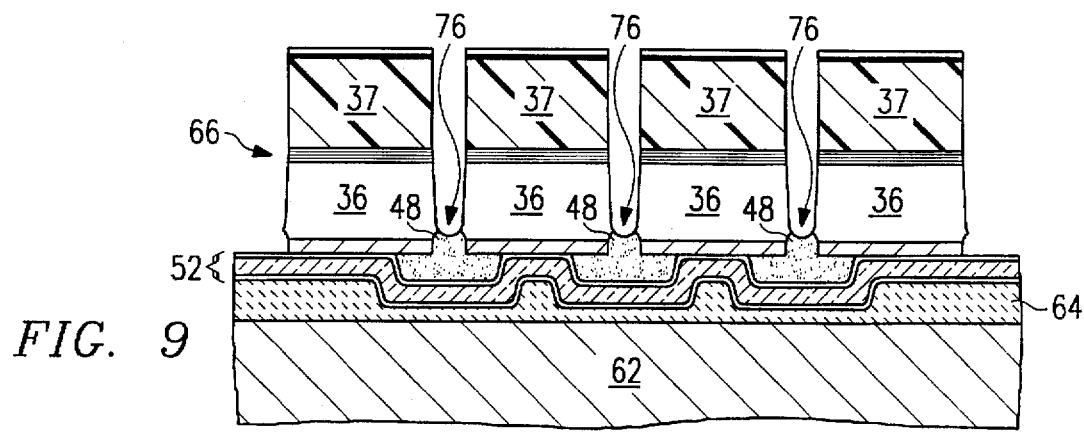
FIG. 9 depicts the ion milled isolation trenches partially completed.

A tri-level resist 37 is deposited on layer 66 as shown in FIG. 8, which is then patterned using the techniques previously described. The openings in this resist are aligned with the elevated etch stop material 48 on the front side of the substrate 36. FIG. 9 shows the trenches 76 which have been ion milled down to the elevated etch stop material 48. The optical coating is protected from damage during this process by the elevated etch stop 48 which is elevating the optical coating 52.

Figure 10:
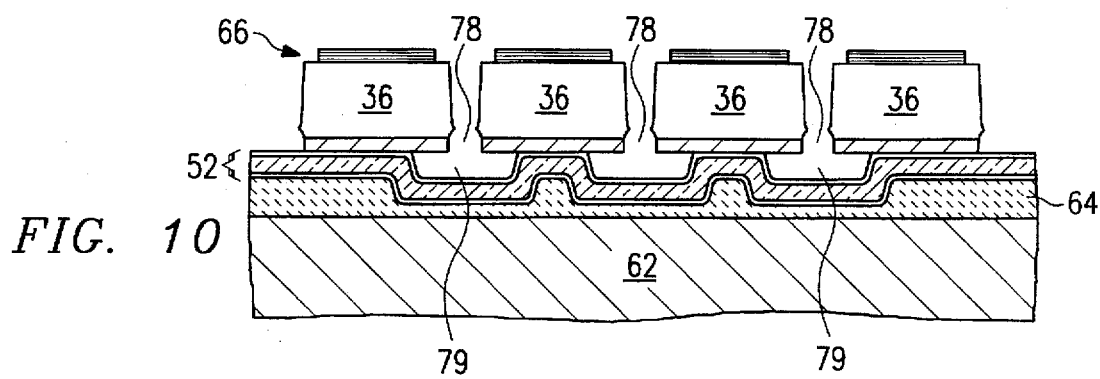
FIG. 10 shows the completed reticulated array of IR sensing capacitors, upside down, still mounted to the carrier.

FIG. 10 shows that unwanted materials have been removed to leave the thermal isolation trenches 78 surrounding the substrate pixels 36. Plasma processes may be performed to remove the remaining parylene etch stop 48.

Figure 11:
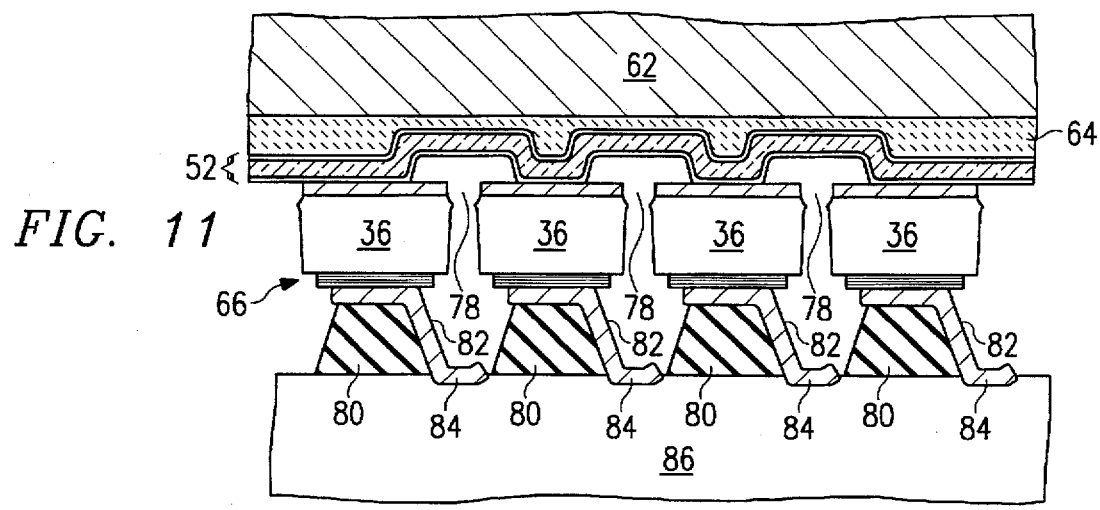
FIG. 11 shows the use of the carrier as a means of supporting the fragile IR sensor array while it is bonded to the planar IC containing the electronic sensing circuitry.

As shown in FIG. 11, the same mechanical carrier 62 is now used to support the fragile IR detector assembly and align the BST 36 mesas with IC mesas 80 such that a bonding material 82 makes electrical connections between each of the pixels by the pixel metallization layer 66 and the processing IC 86 via connection 84. An additional advantage of dual side etching is that BST mesa 36 has lower thermal mass due to extra material being removed during the frontside etch which may provide improved thermal responsivity.

Figure 12:
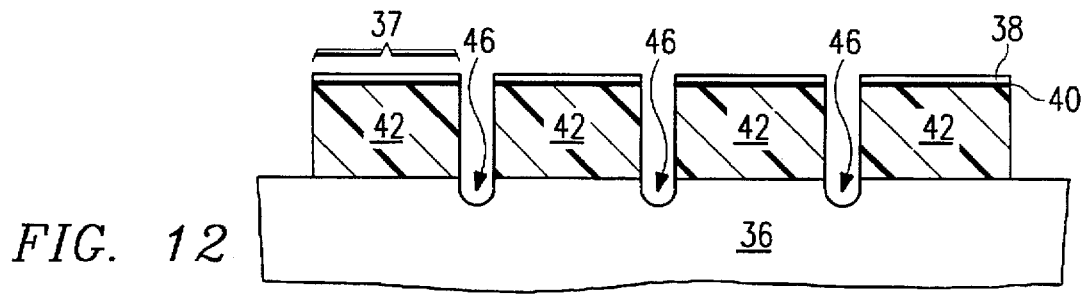
FIG. 12 illustrates the etched trenches surrounding each pixel, but without an initial electrode layer.
Figure 13:
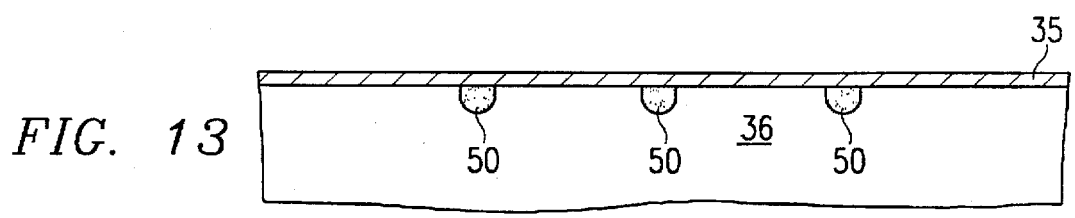
FIG. 13 illustrates the deposition of an organic in the trenches and a continuous electrode formed on the surface.
Figure 14:
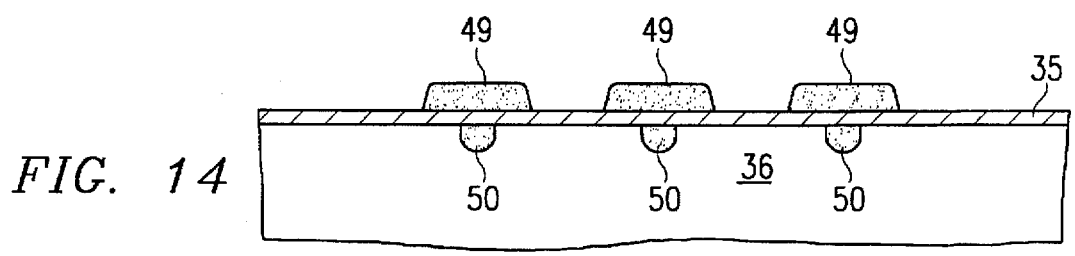
FIG. 14 shows the addition of an organic layer after it has been patterned by photolithography.

In an alternate embodiment, FIG. 12 illustrates the structure of FIG. 3 but without electrode 35. Substrate 36 is patterned by tri-level resist 37 to form a trench 46. The isolation trenches 46 are then filled with an organic frontside etch stop material 48 such as parylene, and the frontside surface of substrate 36 is planarized. Conductive electrode layer 35 is deposited over the surface of substrate 36, yielding the structure shown in FIG. 13. An organic elevation layer 49 such as polyimide release layer, "PIRL", a trademark of Brewer Science, Inc., is applied and patterned by conventional photolithography and aligned to overlap the frontside etch stop material 48, as shown in FIG. 14.

Figure 15:
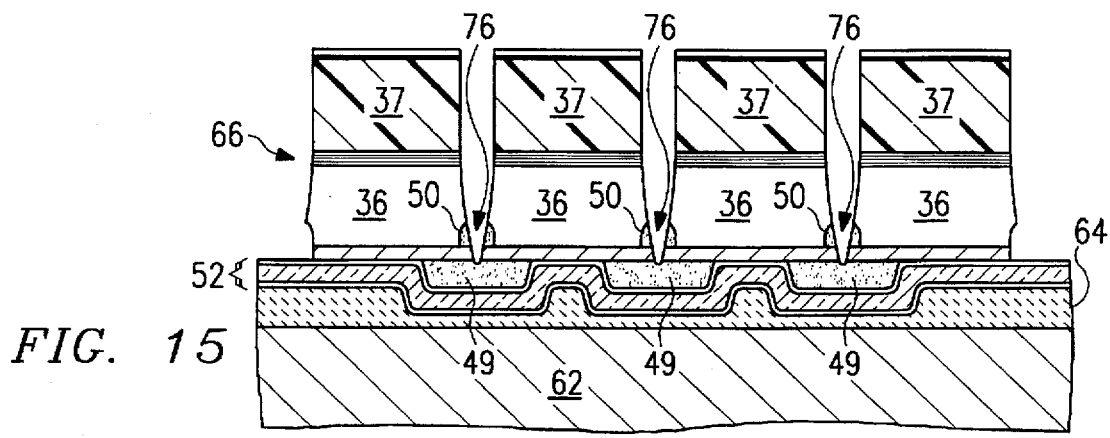
FIG. 15 depicts the ion milled isolation trenches partially completed.

The structure is then processed (optical coat deposition, mechanical carrier attachment, tri-level resist pattern formation) as described herein above. The openings in resist 37 are aligned with the frontside etch stop material 50 on the front side of the substrate 36. FIG. 15 shows the trenches 76 which have been ion milled down through frontside etch stop material 50, through electrode 35, and partially into organic elevation layer 49. The optical coating is protected from damage during this process by organic elevation layer 49 which is elevating the optical coating 52.

Any remaining organic etch stop layer 50 may be removed with a suitable solvent or a dry etch. Portions of electrode layer 35 remaining between pixels 36 are also etched from the structure. The optical coating is again protected during these processes by organic elevation layer 49.

Elevation layer 49 is finally removed to leave the thermal isolation trenches 78 surrounding the substrate pixels 36. If 49 is photoresist, conventional solvents and developers may be used. If 49 is "PIRL", Brewer Science solvents may be used. Elevation layer 49 and frontside etch stop layer 50 are normally different materials, but may alternatively comprise the same material. Metal layer 35 covers the front side of pixel 36 for a full face contact as shown in FIG. 15. This full face contact can improve the electrical properties for some applications.

By the described novel methods is produced a unique, rugged reticulated array of IR sensing pixels. While this invention has been described with reference to illustrative embodiments, this description is not intended to be construed in a limiting sense. There are many variants and combinations of the materials and dimensions shown in these embodiments partially listed in Table 1 and Table 2. The etch stop material and the elevation layer can be many various materials such as but not limited to photoresist, oxide (e.g. $SiO_2$), polyimide, parylene, polyamide, epoxy, nitride (e.g. $Si_3N_4$), "PIRL", and combinations thereof. The etch stop material and the elevation layer can have the same or different compositions. Almost any metal can be used for the continuous electrode 36. Deposition and removal may vary but the functionality is the same. The removal of silicon nitride, $Si_3N_4$, could be performed by plasma etching in a Freon gas, $CF_4$. Parylene may be plasma etched using a different gas mixture. "PIRL" or photoresist may be removed with a liquid solvent. The optical coating both in contact with and elevated above the substrate can vary drastically in thickness and geometry without materially affecting the functions performed. In the dry removal of materials, reactive ion etching, plasma etching and electron cyclotron resonance plasma etching may often be interchanged without serious effect on the fabrication process. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a reticulated infrared array detector said method comprising steps:

(a) providing a ceramic substrate having a front side and a back side;

(b) forming a first mask layer on said front side of said ceramic substrate, etching a first pattern partially into said front side of said ceramic substrate, and removing said first mask layer, thereby forming etch stop trenches having said first pattern;

(c) filling said etch stop trenches with an etch stop material;

(d) forming an elevation layer having a second pattern on said front side of said ceramic substrate, said elevation layer aligned with said etch stop trenches and covering at least said etch stop material in said etch stop trenches;

(e) depositing an optical coating on said front side of said ceramic substrate and on said elevation layer, thereby forming elevated portions of said optical coating above said etch stop trenches;

(f) forming a backside mask layer on said back side of said ceramic substrate, etching a third pattern into said back side of said ceramic substrate, and removing said backside mask layer, said third pattern the same as said first pattern, and aligned with said etch stop trenches on said front side, thereby forming cavities extending down to and into said etch stop material, but not extending to said optical coating;

(g) removing said etch stop material; and (h) removing said elevation layer, thereby forming isolated islands of said ceramic substrate connected by said optical coating, whereby the optical coating has not been exposed to the etching processes of steps (b) and (f).

2. The method according to claim 1, wherein said ceramic substrate is barium strontium titanate.

3. The method according to claim 1, said method further comprising depositing a protective metal layer on said front side of said ceramic substrate before said step of etching said first pattern, and then etching said metal layer during said step of etching said first pattern.

4. The method according to claim 1, wherein said first mask layer is a first tri-level resist, and said step of forming said first mask layer further comprises:

forming a first thick photoresist layer on said front side of said ceramic substrate;

forming a first metal mask layer on said first thick photoresist layer;

forming a first thin photoresist layer on said first metal mask layer;

patterning said first thin photoresist layer using photolithography;

patterning said first metal mask layer using said first thin photoresist layer as a first etch mask; and patterning said first thick photoresist layer using said first metal mask layer as a second etch mask.

5. The method according to claim 1, wherein said etch stop material is selected from the group consisting of: photoresist, silicon oxide, polyimide, parylene, epoxy, and silicon nitride.

6. The method according to claim 1, said step (c) further comprising:

planarizing said etch stop material and said front side of said ceramic substrate after said filling of said etch stop trenches.

7. The method according to claim 6, said method further comprising depositing a protective metal layer on said front side of said ceramic substrate after said step of planarizing said etch stop material and said front side of said ceramic substrate.

8. The method according to claim 1, said step (d) further comprising:

depositing a first organic layer on said front side of said ceramic substrate;

forming a second mask layer on said first organic layer;

etching said first organic layer to form said elevation layer having said second pattern; and removing said second mask layer.

9. The method according to claim 1, wherein said elevation layer is selected from the group consisting of: photoresist, parylene, and polyimide.

10. The method according to claim 1, wherein said steps (c) and (d) are performed at the same time, and said etch stop material and said elevation layer are composed of the same material.

11. The method according to claim 1, wherein said optical coating comprises multiple layers, and said step of depositing said optical coating further comprises:

depositing a conductive metallic layer on said front side of said ceramic substrate and on said elevation layer;

depositing a transparent organic layer on said conductive metallic layer; and depositing a thin transparent metal layer on said transparent organic layer.

12. The method according to claim 11, wherein said conductive metallic layer is NiCr, said transparent organic layer is parylene, and said thin transparent metal layer is NiCr.

13. The method according to claim 1, wherein a top surface of said optical coating opposite said ceramic substrate is mounted to a removable carrier after said step of depositing said optical coating wherein said carrier provides mechanical support for subsequent process steps.

14. The method according to claim 1, said method further comprising thinning said ceramic substrate by mechanically polishing said back side of said ceramic substrate before said step of etching said third pattern.

15. The method according to claim 14, said method further comprising depositing a thin electrical contact on said back side of said ceramic substrate after said step of thinning said ceramic substrate, and etching said thin electrical contact during said step of etching said third pattern.

16. The method according to claim 15, wherein said islands form infrared sensitive capacitors.

17. The method according to claim 15, wherein said thin electrical contact comprises two or more layers, and comprises indium.

18. The method according to claim 1, wherein said backside mask layer is a second tri-level resist, and said step of forming said backside mask layer further comprises:

forming a second thick photoresist layer on said back side of said ceramic substrate;

forming a second metal mask layer on said second thick photoresist layer;

forming a second thin photoresist layer on said second metal mask layer;

patterning said second thin photoresist layer using photolithography;

patterning said second metal mask layer using said second thin photoresist layer as a third etch mask; and patterning said second thick photoresist layer using said second metal mask layer as a fourth etch mask.

19. The method according to claim 1, said step (f) further comprising forming said cavities extending down to and partially into said elevation layer, but not extending to said optical coating.

20. The method according to claim 1, wherein said steps of etching said first and third patterns comprise ion milling.

21. The method according to claim 1, wherein said elevation layer and said etch stop material are composed of the same material, and said steps (g) and (h) are performed at the same time.

22. The method according to claim 1, said method further comprising bump bonding said back side of said ceramic substrate to a signal processing substrate after said step of removing said elevation layer.

* * * * *